US010083652B2

(12) United States Patent
Wilson

(10) Patent No.: US 10,083,652 B2
(45) Date of Patent: Sep. 25, 2018

(54) METHOD, APPARATUS AND COMPUTER PRODUCT TO COMPENSATE FOR MISALIGNED OR OVERLAPPED ELECTRONIC WALLPAPERS

(71) Applicant: International Business Machines Corporation, Armonk, NY (US)

(72) Inventor: John D. Wilson, League City, TX (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 15/146,375

(22) Filed: May 4, 2016

(65) Prior Publication Data

US 2017/0323595 A1 Nov. 9, 2017

(51) Int. Cl.

*G09G 3/3208* (2016.01)
*G06F 3/14* (2006.01)
*G09B 5/02* (2006.01)
*G01R 31/26* (2014.01)

(52) U.S. Cl.

CPC ....... *G09G 3/3208* (2013.01); *G01R 31/2635* (2013.01); *G09G 2300/026* (2013.01); *G09G 2320/0233* (2013.01); *G09G 2340/0464* (2013.01); *G09G 2356/00* (2013.01)

(58) Field of Classification Search

CPC ......... G09G 2356/00; G09G 2300/026; G09G 2340/0464

See application file for complete search history.

(56) References Cited

U.S. PATENT DOCUMENTS

| | | | |
|---|---|---|---|
| 7,274,346 | B2 | 9/2007 | Cok et al. |
| 7,907,154 | B2 | 3/2011 | Rykowski et al. |
| 8,730,130 | B1 | 5/2014 | Pray et al. |
| 8,777,418 | B2 | 7/2014 | Wright et al. |
| 8,935,867 | B2 | 1/2015 | Patterson et al. |

(Continued)

FOREIGN PATENT DOCUMENTS

WO WO2014070684 A1 5/2014

OTHER PUBLICATIONS

Kim, J., et al., “An OLED Driving Currents Compensation Method with a CCD Camera”, 2014 IEEE International Conference on Consumer Electronics (ICCE), Jan. 10-13, 2014, pp. 504-505.

*Primary Examiner* — Lixi C Simpson

(74) *Attorney, Agent, or Firm* — Scully, Scott, Murphy & Presser, P.C.; Kurt Goudy, Esq.

(57) ABSTRACT

A method of compensating for misalignments along a seam of first and second electronic panels installed for a display device is provided. Each of the first and second electronic panels includes a plurality of pixels formed in an i×j matrix, wherein i and j are integers at least one. The method includes controlling a camera device to be placed over the seam, alternately turning on first pixels in a first column of the first electronic panel, the first column being closest to the seam, capturing, using the camera device, images for the respective first pixels, detecting, using a pattern detector, each of the first pixels based on a corresponding one of the captured images, determining one of at least one horizontal displacement or a vertical displacement along the seam, and compensating for the misalignments along the seam based on the determined at least one horizontal displacement or the vertical displacement.

20 Claims, 12 Drawing Sheets

(56) References Cited

U.S. PATENT DOCUMENTS

| | | | |
|---|---|---|---|
| 9,007,279 | B2 | 4/2015 | Calvo Alonso et al. |
| 2003/0067587 | A1 | 4/2003 | Yamasaki et al. |
| 2009/0096711 | A1 | 4/2009 | Jang et al. |
| 2011/0164065 | A1* | 7/2011 | Mate ..................... G06F 3/1446 345/676 |
| 2012/0120372 | A1 | 5/2012 | Timoner et al. |
| 2012/0300044 | A1 | 11/2012 | Thomas et al. |
| 2013/0307877 | A1* | 11/2013 | Alonso .................. G09G 3/006 345/690 |
| 2014/0193037 | A1* | 7/2014 | Stitzinger ................ G09G 5/12 382/103 |
| 2015/0146017 | A1 | 5/2015 | Kim et al. |
| 2015/0170399 | A1 | 6/2015 | Li et al. |
| 2016/0162243 | A1* | 6/2016 | Neisler .................... G09G 5/08 345/163 |
| 2017/0192733 | A1* | 7/2017 | Huang .................. G06F 3/1446 |

* cited by examiner

FIG. 3A
DR2
DR1
P16 P26 P36 P46 P56 P66 P76 P86 P96
P15 P25 P35 P45 P55 P65 P75 P85 P95
P14 P24 P34 P44 P54 P64 P74 P84 P94
P13 P23 P33 P43 P53 P63 P73 P83 P93
P12 P22 P32 P42 P52 P62 P72 P82 P92
PIMG
VIMG
VB16 VB26 VB36 VB46 VB56 VB66 VB76 VB86 VB96
VB15 VB25 VB35 VB45 VB55 VB65 VB75 VB85 VB95
VB14 VB24 VB34 VB44 VB54 VB64 VB74 VB84 VB94
VB13 VB23 VB33 VB43 VB53 VB63 VB73 VB83 VB93
VB12 VB22 VB32 VB42 VB52 VB62 VB72 VB82 VB92
VB11 VB21 VB31 VB41 VB51 VB61 VB71 VB81 VB91

METHOD, APPARATUS AND COMPUTER PRODUCT TO COMPENSATE FOR MISALIGNED OR OVERLAPPED ELECTRONIC WALLPAPERS

FIELD

The present disclosure generally relates to a display device, and more specifically, to a method, an apparatus, or a computer product to compensate for misaligned or overlapped electronic wallpapers.

BACKGROUND

Electronic wallpapers implemented based on, e.g., an organic light emitting diode (OLED), an active matrix organic light emitting diode (AMOLED), etc are installed together for a large display.

During the installation of the electronic wallpapers together, misalignments or anomalies along a seam of the electronic wallpapers might occur, so that they might not completely line up, and thus, image distortions may occur due to misalignments of the electronic wallpapers.

Thus, a user may want to install the electronic wallpapers together with a minimal amount of misalignment or to compensate for the misalignments.

SUMMARY

In one aspect there is provided a method of compensating for misalignments along a seam of first and second electronic panels installed for a display device. Each of the first and second electronic panels includes a plurality of pixels formed in an i×j matrix (here, i and j are integers at least one). The method includes controlling a camera device to be placed over the seam, alternately turning on first pixels in a first column of the first electronic panel, the first column being closest to the seam, capturing images for the respective first pixels using the camera device, detecting each of the first pixels based on a corresponding one of the captured images using a pattern detector, determining one of at least one horizontal displacement or a vertical displacement along the seam, and compensating for the misalignments along the seam based on the determined at least one horizontal displacement or the vertical displacement.

In another aspect there is provided an apparatus of compensating for misalignments along a seam of first and second electronic panels installed for a display device. Each of the first and second electronic panels includes a plurality of pixels formed in an i×j matrix (here, i and j are integers at least one). The apparatus includes a control device, a camera device, a pattern detector, and a pixel driver. The control device controls the pixel driver for driving first pixels in a first column of the first electronic panel to alternately turn on the first pixels, wherein the first column is closest to the seam. The camera device is placed over the seam to capture images for the respective first pixels in a first column under a control by the control device. The pattern detector detects each of the first pixels based on a corresponding one of the captured images. The control device further determines one of at least one horizontal displacement or a vertical displacement along the seam and compensates for misalignments along the seam based on the determined at least one horizontal displacement or the vertical displacement.

Further, in another aspect, there is provided a computer program product for performing a method of compensating for misalignments along a seam of first and second electronic panels. The computer program product is stored in a non-transitory computer-readable storage medium having computer readable program instructions. The computer readable program instructions are read and carried out by a processor. Each of the first and second electronic panels includes a plurality of pixels formed in an i×j matrix, wherein i and j are integers at least one. The method includes controlling a camera device to be placed over the seam, alternately turning on first pixels in a first column of the first electronic panel, the first column being closest to the seam, capturing images for the respective first pixels using the camera device, detecting each of the first pixels based on a corresponding one of the captured images using a pattern detector, determining one of at least one horizontal displacement or a vertical displacement along the seam, and compensating for misalignments along the seam based on the determined at least one horizontal displacement or the vertical displacement.

DETAILED DESCRIPTION OF THE EMBODIMENTS

Figure 1A:
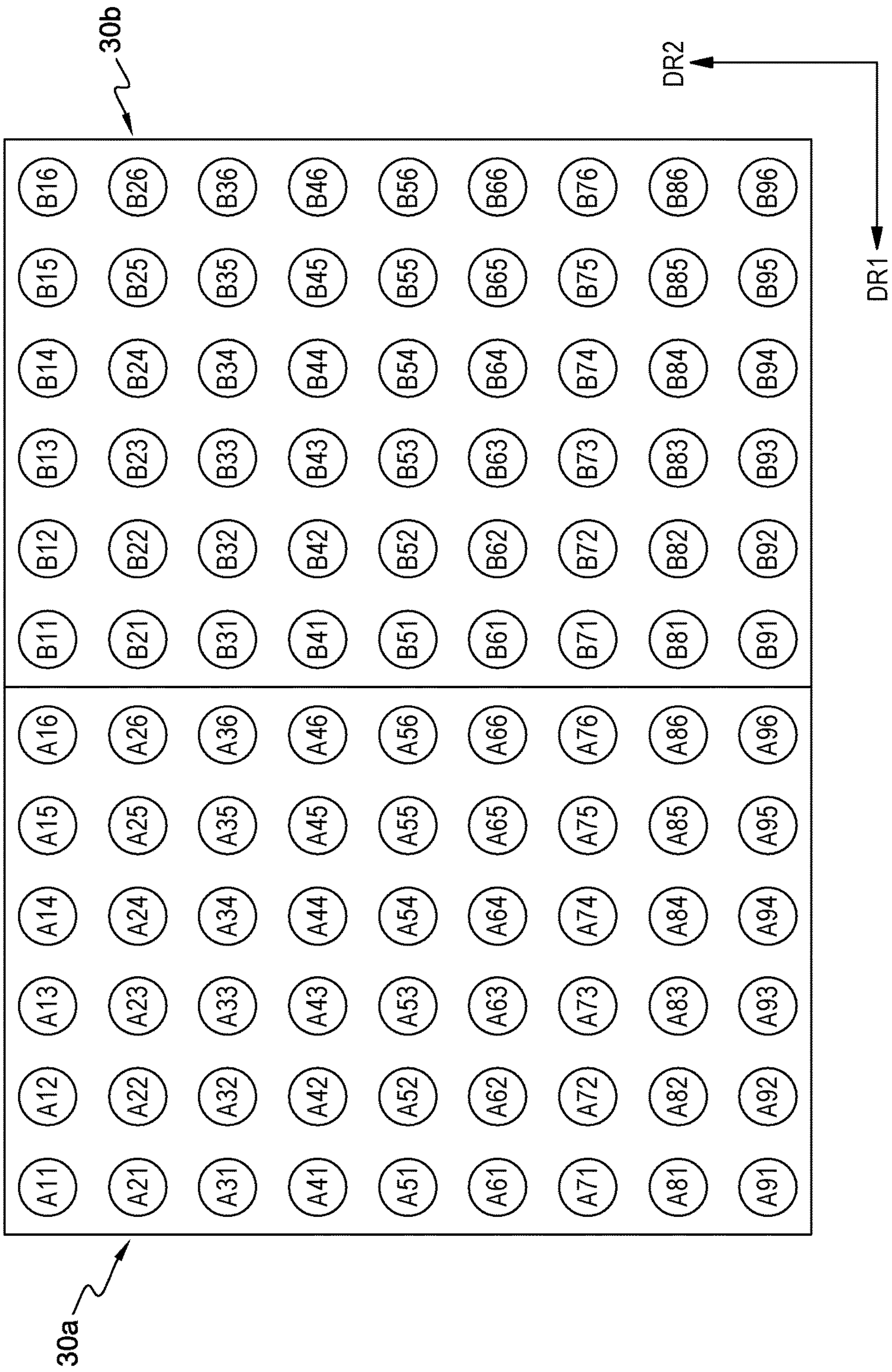
FIG. 1A illustrates an example of two electronic wallpaper panels which are ideally installed for a large display.

Like reference numerals may refer to like elements throughout the written descriptions and drawings.

FIG. 1A illustrates an example of two electronic wallpaper panels 30*a* and 30*b* which are ideally installed for a large display.

Referring to FIG. 1A, the first and second electronic wallpaper panels 30*a* and 30*b* are ideally installed such that there is no displacement in a direction such as a horizontal direction DR1 or a vertical direction DR2. Each of the electronic wallpaper panels 30*a* and 30*b* includes a plurality of pixels having an i×j matrix form (here i and j are integers at least one). While it is illustrated in FIG. 1A, or other figures of the present disclosure that there are only two electronic wallpaper panels 30*a* and 30*b* and each panel has pixels of a 9×6 (i=9 and j=6) matrix for the purpose of illustration, the present disclosure is not limited thereto, and for example, embodiments of the present disclosure can be applied to a case where more than two electronic wallpaper panels are installed.

For example, the first electronic wallpaper panel 30*a* includes a first group of pixels A11 to A96, and the second electronic wallpaper panel 30*b* includes a second group of pixels B11 to B96.

These two electronic wallpaper panels 30*a* and 30*b* are installed together or combined for a large scale display. For example, each electronic wallpaper panels 30*a* or 30*b* includes papers with electronic inks or are implemented using, not limited to, an OLED or an AMOLED.

Figure 1B:
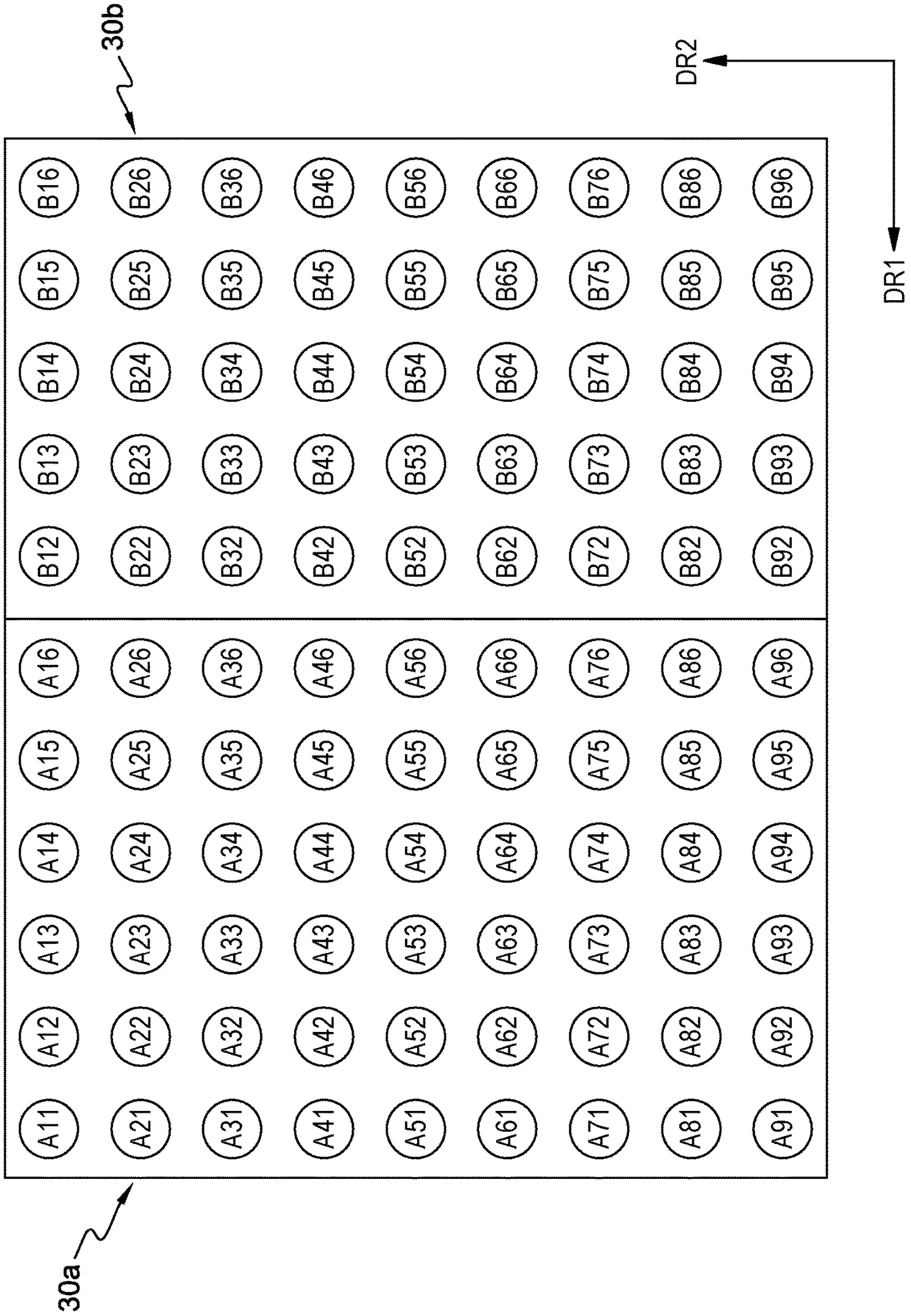
FIG. 1B illustrates an example of two electronic wallpaper panels which are installed with a horizontal displacement along a seam thereof.
Figure 1C:
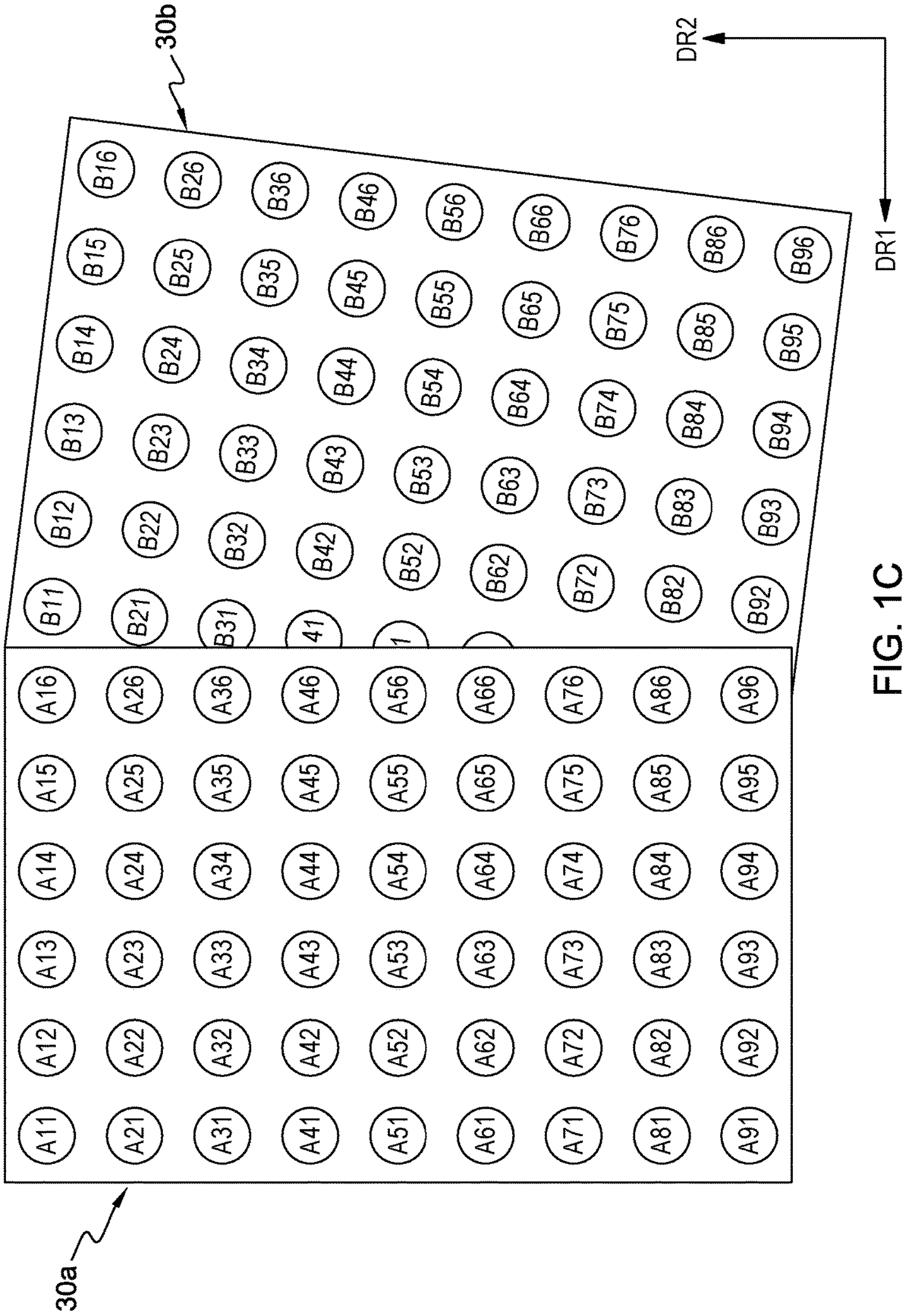
FIG. 1C illustrates an example of two electronic wallpaper panels which are installed with different horizontal displacements along a seam thereof.
Figure 1D:
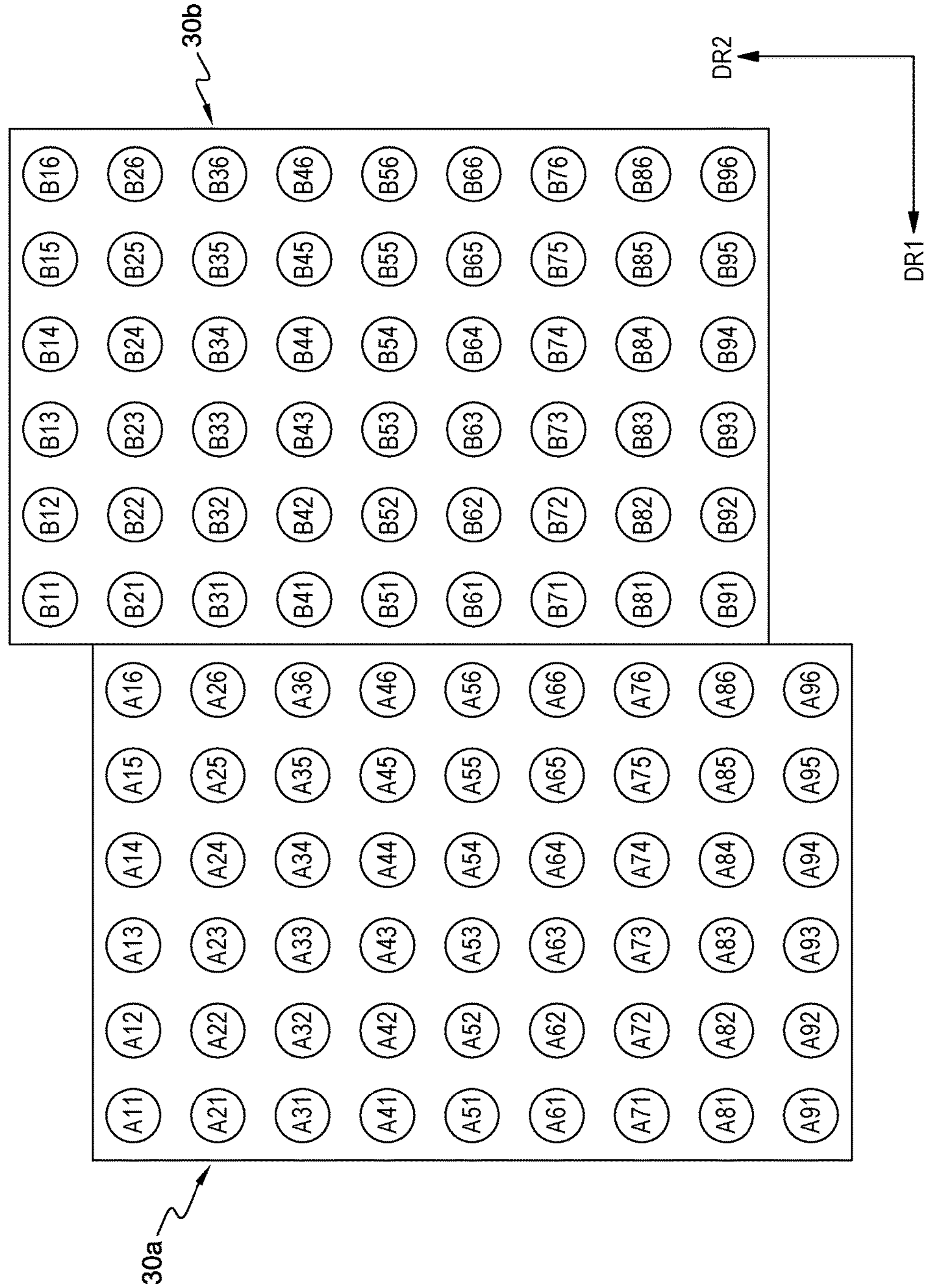
FIG. 1D illustrates an example of two electronic wallpaper panels which are installed with a vertical displacement along a seam thereof.
Figure 1E:
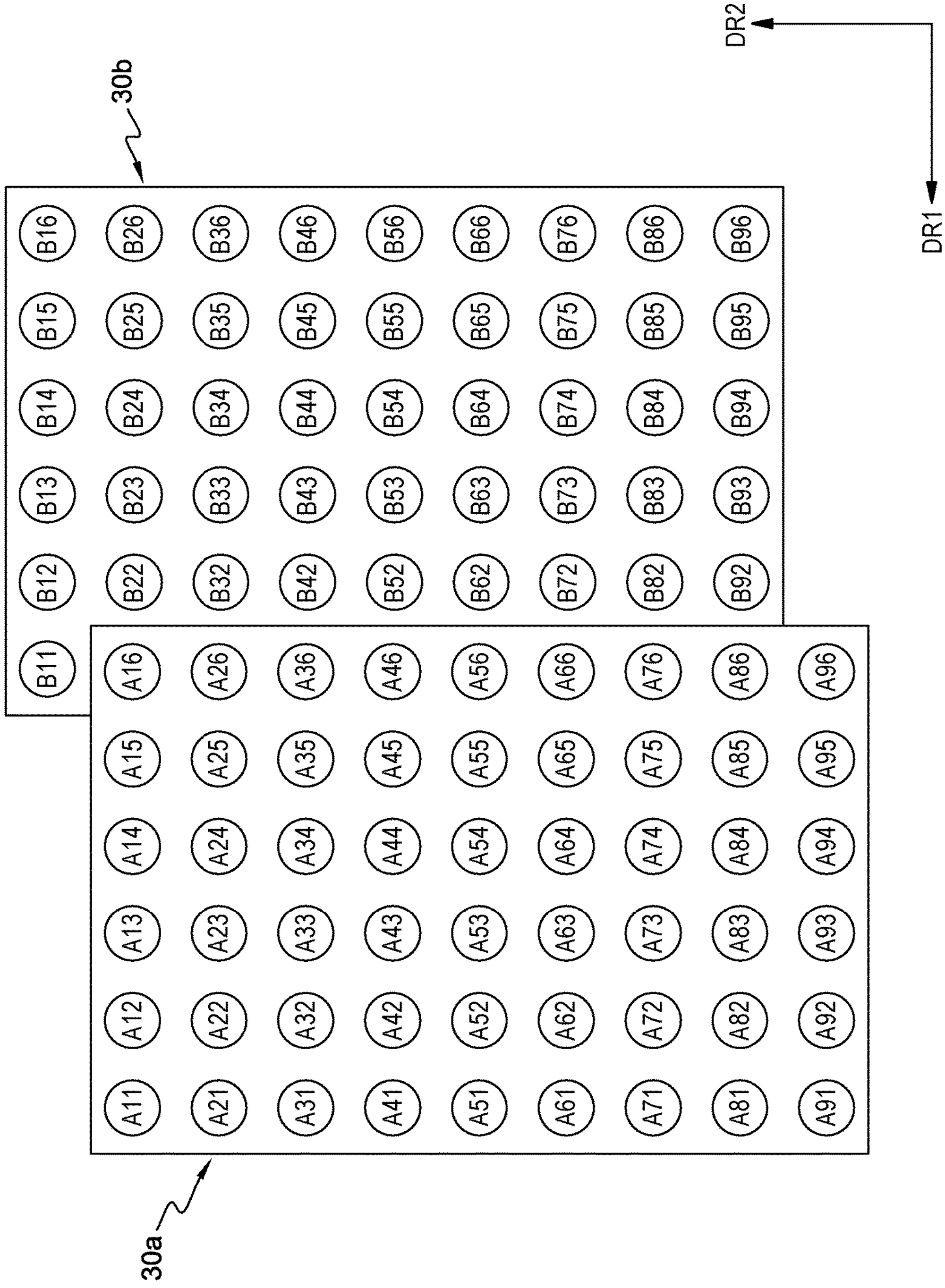
FIG. 1E illustrates an example of two electronic wallpaper panels which are installed with a horizontal displacement and a vertical displacement along a seam thereof.

FIG. 1B illustrates an example of two electronic wallpaper panels 30*a* and 30*b* which are installed with a horizontal displacement along a seam thereof. FIG. 1C illustrates an example of the two electronic wallpaper panels 30*a* and 30*b* which are installed with different horizontal displacements along a seam thereof. FIG. 1D illustrates an example of the two electronic wallpaper panels 30*a* and 30*b* which are installed with a vertical displacement along a seam thereof. FIG. 1E illustrates an example of the two electronic wallpaper panels 30*a* and 30*b* which are installed with a horizontal displacement and a vertical displacement along a seam thereof.

Referring to FIG. 1B, the second electronic wallpaper panel 30*b* is displaced toward the first electronic wallpaper panel 30*a* by a certain distance (e.g., one pixel distance). For example, the first and second electronic wallpaper panels 30*a* and 30*b* overlap each other with a displacement of one pixel distance in the horizontal direction DR1, which is referred to as a horizontal displacement. As a result, the first column pixels B21 to B91 of the second electronic wallpaper panel 30*b* are blocked by the first electronic wallpaper panel 30*a* so that the turning on of the first column pixels B21 to B91 might not be observed.

In addition, the first and second electronic wallpaper panels 30*a* and 30*b* may have different horizontal displacements at various points along the seam thereof, as shown in FIG. 1C. In an example illustrated in FIG. 1C, a horizontal displacement for the top row (e.g., first row) is zero and a horizontal displacement for the bottom row (e.g., ninth row) is one pixel distance. Thus, some pixels (e.g., B11, B21 and B31) of the first column pixels B11 to B61 of the second electronic wallpaper panel 30*b* may be displayed and other pixels (e.g., B51 to B91) thereof may be blocked from being displayed (e.g., lit up) by the first electronic wallpaper panel 30*a*.

On the other hand, the first and second electronic wallpaper panels 30*a* and 30*b* may have a vertical displacement (e.g., one pixel distance to the upward), as shown in FIG. 1D. Thus, a horizontal line corresponding to n-th row pixels of the first electronic wallpaper panel 30*a* and a horizontal line corresponding to n-th row pixels of the second electronic wallpaper panel 30*b* might not be aligned to each other. Here, "n" is an integer such that $1 \leq n \leq i$.

In addition, the first and second electronic wallpaper panels 30*a* and 30*b* may have both a horizontal displacement (e.g., one pixel distance to the left), and a vertical displacement (e.g., one pixel distance to the upward), as shown in FIG. 1E.

Figure 2:
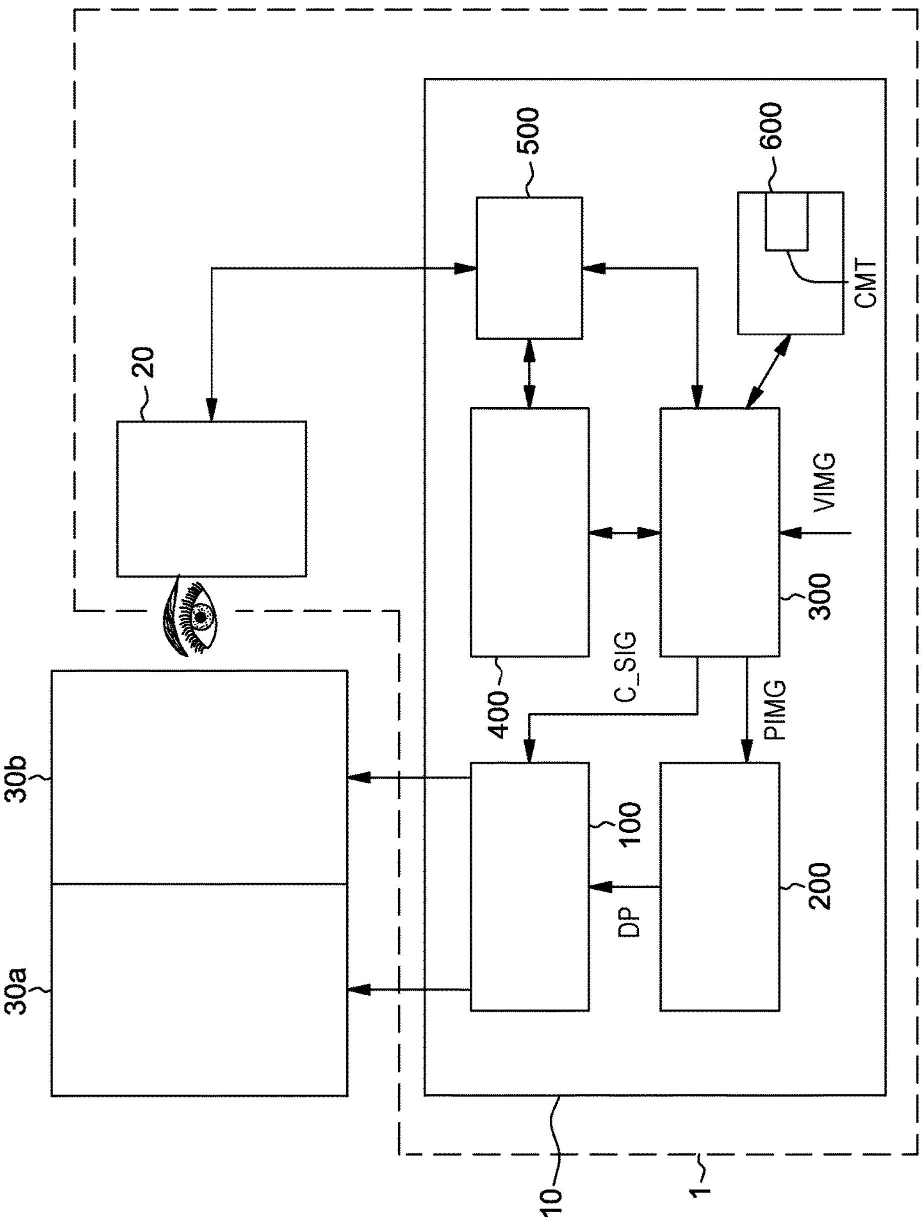
FIG. 2 illustrates an example of an apparatus of compensating for misalignments between the two electronic wallpaper panels of FIGS. 1B to 1E according to an embodiment.

FIG. 2 illustrates an example of an apparatus 1 of compensating for misalignments between the two electronic wallpaper panels 30*a* and 30*b* of FIGS. 1B to 1E according to an embodiment.

Referring to FIG. 2, the apparatus 1 includes a control device 10 configured to control an operation of the apparatus 1 and a camera device 20. The camera device is placed over a seam of the first and second electronic wallpaper panels 30*a* and 30*b* for capturing images of pixels in vicinity of the seam under a control by the control device 10.

The control device 10 may include a pixel driver 100, a pattern generator 200, a control and analysis unit (e.g., a processor) 300, a pattern detector 400, a camera interface 500, and a memory 600.

In an embodiment, each of the first and second electronic wallpaper panels 30*a* and 30*b* includes a plurality of pixels (not shown) in an i×j matrix form, a plurality of gate lines (not shown) in a first direction (e.g., a horizontal direction), and a plurality of data lines (not shown) in a second direction (e.g., a vertical direction) perpendicular to the first direction. Each of the pixels is connected to a corresponding one of the gate lines and a corresponding one of the data lines. Each of the pixels may include R, G and B unit pixels, and each of the R, G and B unit pixels may have an electroluminescent (EL) element. The EL elements may have R, G, and B organic emission layers interposed between an anode electrode and a cathode electrode thereof, respectively, which emits light in response to a voltage applied between the anode and cathode electrodes.

As shown in FIG. 2, in an embodiment, the control and analysis unit 300 may control the pattern generator 200 to provide a data pattern DP to the pixel driver 100. The control and analysis unit 300 may also control the pixel driver 100 by providing timing control signals C_SIG to the pixel driver 100. The pixel driver 100 may generate and output the gate signals and data signals to each of the pixels using the data pattern DP and the timing control signals C_SIG. In an embodiment, the pixel driver 100 may include a data driver (not shown) for generating the data signals and a gate driver (not shown) for generating the gate signals.

In an embodiment, the pixel driver 100 may individually drive the respective first electronic wallpaper panels 30*a* and 30*b* with the data and gate signals.

The control and analysis unit 300 may further control the camera device 20 to be adjacent to the first and electronic wallpaper panels 30*a* and 30*b* through the camera device interface 500. For example, the control and analysis unit 300 may control the camera device 20 to be placed over the seam of the first and electronic wallpaper panels 30*a* and 30*b* to capture images for respective turn-on pixels thereof through the camera device interface 500. In an embodiment, the camera device 20 may be placed at a middle position in the vertical direction DR2 of the seam at a close focus distance (e.g., 5 cm), however the camera device 20 may be placed at other positions of the seam.

The control and analysis unit 300 may establish or setup a communication channel with the camera device 20 through the camera device interface 500 to begin a calibration procedure.

In an embodiment for performing the calibration procedure, the control and analysis unit 300 may control the pixel driver 100 and the pattern generator 200 to alternately turn on sixth column pixels A16 to A96 of the first electronic wallpaper panel 30*a*. The sixth column pixels A16 to A96 may be selected because they are positioned to be closest to the seam of the first and second electronic wallpaper panels 30*a* and 30*b*. In this operation, for example, the sixth column pixels A16 to A96 may alternately be turned on from the top pixel (e.g., A16) toward the bottom pixel (e.g., A96) or vice versa. To this end, the pixel driver 100 may generate and output the data signals and the gate signals to the respective sixth column pixels A16 to A96.

The camera device 20 may capture an image corresponding to each of the sixth column pixels A16 to A96 and transmit the captured pixel image to the pattern detector 400 through the camera device interface 500. In an embodiment, the camera device 20 may communicate with the camera device interface 500 of the control and analysis unit 300 via a wired or wireless channel. The wired channel may be established based technologies, e.g., the Internet, a local area network (LAN), a wide area network (WAN), or the like. The wireless channel may be established based technologies, e.g., near field communication (NFC), Bluetooth, code division multiple access (CDMA), global system for mobile communication (GSM), wideband CDMA, CDMA-2000, time division multiple access (TDMA), long term evolution (LTE), wireless LAN, or the like.

The pattern detector 400 may receive the captured pixel image, detect a certain turn-on pixel based on at least the captured pixel image, and provide information of the detected turn-on pixel to the control and analysis unit 300. In the present disclosure, the detecting of a turn-on pixel may include determining identification (ID) of the turn-on pixel, for example, determining which of the pixels (e.g., A16 to A96) corresponds to the turn-on pixel.

In an embodiment, when the control and analysis unit 300 controls the pixel driver 100 and the pattern generator 200 to alternately turn on the sixth column pixels A16 to A96, the pattern detector 400 may be synchronized with the control and analysis unit 300 to determine which of the sixth column pixels A16 to A96 has actually been turned on for each received captured pixel image, and thus, the pattern detector 400 may identify one of the sixth column pixels A16 to A96 corresponding to each received captured pixel image. In addition, the pattern detector 400 may provide detected results for the sixth column pixels A16 to A96 to the control and analysis unit 300.

For example, the control and analysis unit 300 may control the pixel driver 100 and the pattern generator 200 to turn on a pixel (e.g., A16) out of the sixth column pixels A16 to A96 and control the camera device 20 to capture an image for the turn-on pixel (e.g., A16). The camera device 20 may transmit the captured image to the pattern detector 200, the pattern detector 400 may analyze the captured image to detect the turn-on pixel (e.g., A16), and provide information of the detected turn-on pixel (e.g., A16) to the control and analysis unit 300.

For the rest pixels A26 to A96, the pixel driver 100, the pattern generator 200, the control and analysis unit 300, the pattern detector 400, and the camera device 20 may operate in substantially the same or similar manner as/to those described above for the pixel A16.

To this end, the control and analysis unit 300, the camera 20, and the pattern detector 400 may be implemented and operated according to a machine vision technique.

In addition, in an embodiment, the pattern detector 400 may include an image processor (not shown) to analyze the captured image provided by the camera device 20 and to determine an ID of a turn-on pixel in the captured image.

A. Determination of Horizontal Displacements Along a Seam of Electronic Wallpaper Panels To determine a horizontal displacement along a seam for n-th row pixels of the first electronic wallpaper panel 30*a* and n-th row pixels of the second electronic wallpaper panel 30*b*, the control and analysis unit 300 may control the pixel driver 100 and the pattern generator 200 to progressively turn on the n-th row pixels of the second electronic wallpaper panel 30*b* from the leftmost column pixel (e.g., Bn1) to the rightmost column pixel (e.g., Bnj) or vice versa.

If the electronic wallpaper panels (e.g., 10*a* and 10*b*) have substantially the same horizontal displacements regardless of points along the seam in the vertical direction DR2, as shown in FIG. 1B, the horizontal displacement is representatively determined at one (e.g., n-th row) of the first to i-th rows of the second electronic wallpaper panel 30*b*. For example, the control and analysis unit 300 may control the pixel driver 100 and the pattern generator 200 to progressively turn on the n-th row pixels Bn1 to Bn6 of the second electronic wallpaper panel 30*b* from the pixel Bn1 toward the pixel Bn6 until a lit-up pixel is detected by the pattern detector 400.

Referring to FIGS. 1B and 2, since the second electronic wallpaper panel 30*b* is installed to overlap the first electronic wallpaper panel 30*a* by one pixel distance, the pixel Bn1, which is a first column pixel of the n-th row pixels Bn1 to Bn6, is placed behind a portion of the first electronic wallpaper panel 30*a*. Thus, when the pixel Bn1 is turned on, the camera device 20 may capture an image for the turn-on pixel Bn1 to transmit the captured image to the pattern detector 400, the pattern detector 400 may detect no lit-up pixel for the turn-on pixel Bn1 by a analysis result on the captured image and provide the detection result for the turn-on pixel Bn1 to the control and analysis unit 300. Then, when the pixel Bn2, which is a second column pixel of the n-th row pixels Bn1 to Bn6, is turned on, the camera device 20 may capture an image for the turn-on pixel Bn2 and transmit the captured image to the pattern detector 400, the pattern detector 400 may eventually detect the lit-up pixel for the turn-on pixel Bn2 and provide the detection result for the turn-on pixel Bn2 to the control and analysis unit 300.

In an embodiment, the pattern detector 400 might not determine the pixel Bn1 as a lit-up pixel when luminance of the turn-on pixel Bn1 is lower than a predetermined value and determine the pixel Bn2 as a lit-up pixel when luminance of the turn-on pixel Bn2 is equal to or higher than the predetermined value. For example, the predetermined value may range between a half luminance of a turn-on pixel (e.g., Bn2, Bn3, Bn4, Bn5 or Bn6) and the luminance of the turn on pixel. In practice, the turned on pixels would be driven near maximum luminance. As the surrounding pixels are not turned on, using a half luminance as the predetermined threshold value would likely be more than adequate to consistently detect the turned on pixels.

Thus, based on the detection results provided from the pattern detector 400, the control and analysis unit 300 may determine that the horizontal displacement along the seam of the first and second electronic wallpaper panels 30*a* and 30*b* is one pixel distance.

In reality, however, it might not be known to the apparatus 1 whether the first and second electronic wallpaper panels 30*a* and 30*b* have the same horizontal displacement regardless of points along the seam or even whether the first and second electronic wallpaper panels 30*a* and 30*b* have no horizontal displacement along the seam.

For example, in a case where the first and second electronic wallpaper panels 30*a* and 30*b* have different horizontal displacements at various points along the seam thereof, as shown in FIG. 1C, determination of the horizontal displacements for at least two points (or rows) along the seam is needed.

In an embodiment, the horizontal displacements for the top row (e.g., the first row) and the bottom row (e.g., the i-th row) may representatively be determined. However, the present disclosure is not limited thereto. For example, any pair of combination of the first to i-th rows may be selected for their horizontal displacements to be determined.

The control and analysis unit 300 may control the pixel driver 100 and the pattern generator 200 to progressively turn on the first row pixels B11 to B16 of the second electronic wallpaper panel 30*b* in an order from the pixel B11 toward the pixel B16, or vice versa.

Referring to FIGS. 1C and 2, when the pixel B11 is turned on, the camera device 20 may capture an image for the turn-on pixel B11 to transmit the captured image to the pattern detector 400, the pattern detector 400 may detect a lit-up pixel for the turn-on pixel B11 based on an analysis result on the captured image and provide the detection result for the turn-on pixel B11 to the control and analysis unit 300. Thus, based on the detection result for the turn-on pixel B11, the control and analysis unit 300 may determine that the horizontal displacement for the first row is zero.

In addition, the control and analysis unit 300 may control the pixel driver 100 and the pattern generator 200 to progressively turn on the ninth row pixels B91 to B96 of the second electronic wallpaper panel 30*b* in an order from the pixel B91 toward the pixel B96, or vice versa.

When the pixel B91 is turned on, the camera device 20 may capture an image for the turn-on pixel B91 to transmit the captured image to the pattern detector 400, the pattern detector 400 may detect no lit-up pixel for the turn-on pixel B91 based on an analysis result on the captured image and provide the detection result for the turn-on pixel B91 to the control and analysis unit 300. Then, when the pixel B92 is turned on, the camera device 20 may capture an image for the turn-on pixel B92 to transmit the captured image to the pattern detector 400, the pattern detector 400 may detect a lit-up pixel for the turn-on pixel B92 based on an analysis result on the captured image and provide the detection result for the turn-on pixel B92 to the control and analysis unit 300.

Thus, based on the detection results provided from the pattern detector 40, the control and analysis unit 300 may determine that the horizontal displacement for the ninth row is one pixel distance and may also determine that the first and second electronic wallpaper panels 30*a* and 30*b* are installed to be skewed in a clock-wise direction by a certain angle which is defined by a ratio of the horizontal displacements at the respective first and ninth rows.

The control and analysis unit 300 may store the determined horizontal displacements for the first and ninth rows or the determined skewed angle into the memory 600.

B. Determination of a Vertical Displacement Along a Seam Between Electronic Wallpaper Panels To determine a vertical displacement along a seam of the first and second electronic wallpaper panels 30*a* and 30*b*, the control and analysis unit 300 may control the pixel driver 100 and the pattern generator 200 to turn on n-th row pixels An1 to An6 of the first electronic wallpaper panel 30*a*. In addition, the control and analysis unit 300 may control the pixel driver 100 and the pattern generator 200 to turn on pixels in first to i-th rows of the second electronic panel alternately by a unit of a row.

In an embodiment, "n" may be selected to be 5, which is an integer around i/2. In this case, the control and analysis unit 300 may control the pixel driver 100 and the pattern generator 200 to turn on fifth row pixels A51 to A56, e.g., which is positioned in the vicinity of the middle in a vertical direction DR2 of the first to ninth rows, of the first electronic wallpaper panel 30*a* and fifth row pixels B51 to B56 of the second electronic wallpaper panel 30*b*.

Referring to FIGS. 1D and 2, when the fifth rows pixels A51 to A56 and B51 to B56 of the respective first electronic wallpaper panels 30*a* and 30*b* are turned on, the camera device 20 may capture an image of the turn-on pixels A51 to A56 and B51 to B56, may transmit the captured image to the pattern detector 400. The pattern detector 400 may detect a first horizontal line corresponding to the fifth row of the first electronic wallpaper panel 30*a* and a second horizontal line corresponding to the fifth row of the second electronic wallpaper panel 30*b*, and determine whether the first and second horizontal lines are aligned within a predetermined offset (e.g., a half pixel distance). In an embodiment with extremely dense pixels, and a user viewing distance may get larger, the rows may be considered aligned even when offset by whole numbers of pixels.

As exemplary shown in FIG. 1D, since the second electronic wallpaper panel 30*b* is installed with the first electronic wallpaper panel 30*a* having a displacement to the upward, the pattern detector 400 may determine that the first and second horizontal lines are not aligned within the predetermined offset and provide the determined result to the control and analysis unit 300. Therefore, the control and analysis unit 300 may control the pixel driver 100 and the pattern generator 200 to turn on the fifth row pixels A51 to A56 of the first electronic wallpaper panel 30*a* and k-th row pixels (here, "k" is an integer such that $1 \leq k \leq 5$ and $5 \leq k \leq 9$). The pattern detector 400 may detect the first horizontal line corresponding to the fifth row of the first electronic wallpaper panel 30*a* and a third horizontal line corresponding to the k-th row of the second electronic wallpaper panel 30*b*, and determine whether the first and third horizontal lines are aligned within the predetermined offset (e.g., a half pixel distance). The pattern detector 400 may determine that the first and third horizontal lines are aligned within the predetermined offset and provide the determined result to the control and analysis unit 300. Thus, the control and analysis unit 300 may determine that the first and second electronic wallpaper panels 30*a* and 30*b* have a vertical displacement of one pixel distance to the upward based on the determined results provided from the pattern detector 400 and store the determined vertical displacement into the memory 600.

In an embodiment, "k" may be selected in a manner in which pixels in a row closer to the fifth row of the first electronic wallpaper panel 30*a* are turned on earlier than pixels in another row. For example, fourth or sixth row pixels of the second electronic wallpaper panel 30*b* are turned on earlier than other row pixels.

It might not be known to the apparatus 1 whether the first and second electronic wallpaper panels 30*a* and 30*b* have horizontal displacements along the seam or even whether the first and second electronic wallpaper panels 30*a* and 30*b* have no horizontal displacement along the seam. Thus, in an embodiment, the procedures of determining the vertical displacement described in section B may be performed after the procedures of determining the horizontal displacements described in section A, or vice versa.

For example, when the first and second electronic wallpaper panels 30*a* and 30*b* are installed to both of a horizontal displacement of one pixel distance and a vertical displacement of one pixel distance, as exemplary shown in FIG. 1E, the apparatus 1 may be operated to perform the procedures of determining the horizontal displacement described in section A and the procedures of determining the vertical displacement described in section B.

The above-mentioned methods are simplified for the purpose of illustration. Other anomalies or displacements than the horizontal and vertical displacements may be introduced as the electronic wallpaper panels are stretched during installation. This may cause nonlinear displacements at various points along the seam. In this case, multiple checks may be taken along the full seam and the control device 10 may perform best fit analysis to determine the compensations.

Figure 3A:
FIG. 3A illustrates an example of a compensation mapping table used for compensating for misalignment between two electronic wall paper panels according to an embodiment.
Figure 3B:
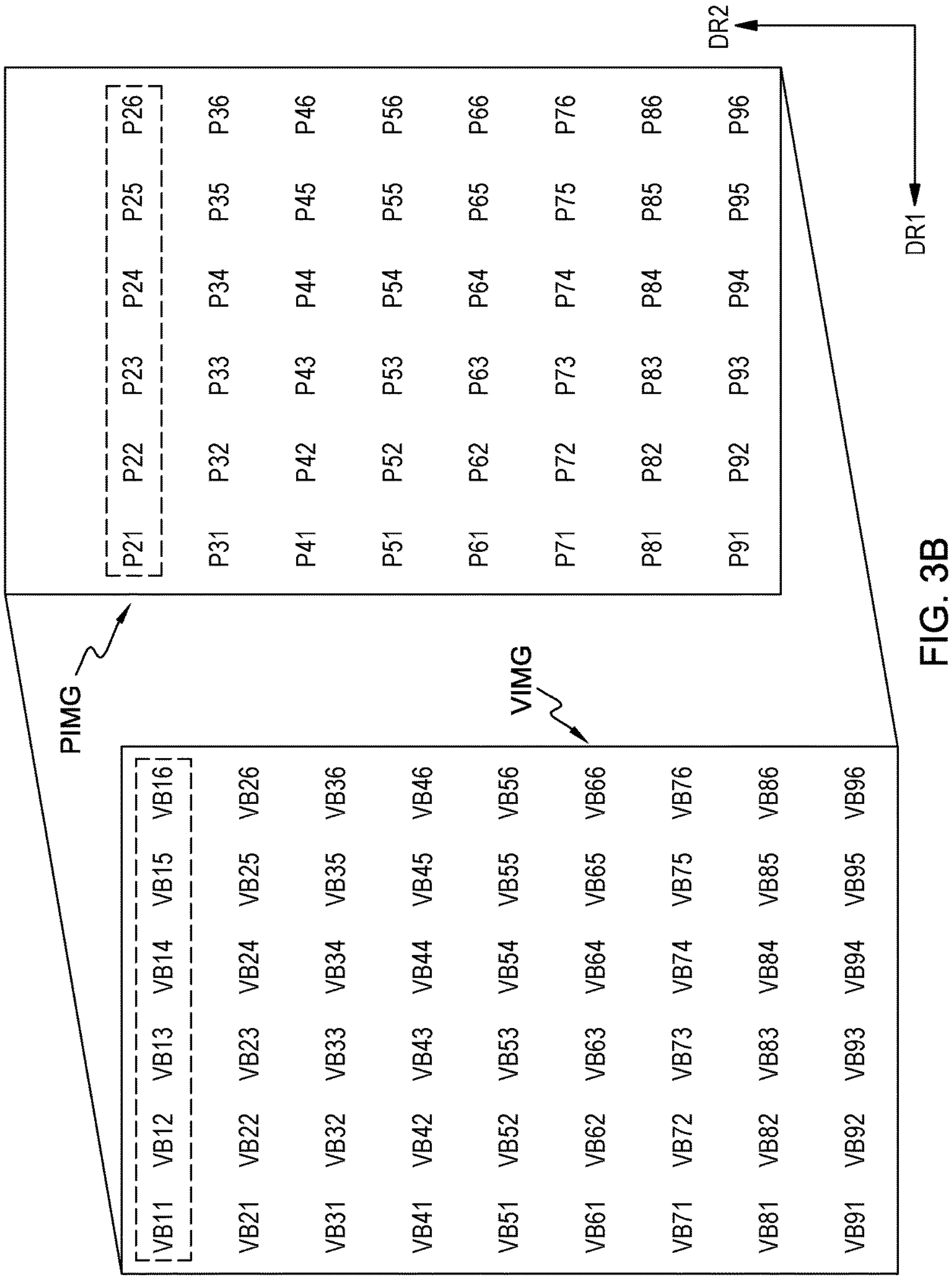
FIG. 3B illustrates an example of the compensation mapping table used for compensating for misalignment between two electronic wall paper panels according to an embodiment.

FIGS. 3A and 3B illustrate examples of a compensation mapping table CMT used for compensating for misalignments between two electronic wall paper panels according to an embodiment.

Referring back to FIG. 2, in an embodiment, the memory 600 may include a compensation mapping table CMT. The control and analysis unit 300 may receive the virtual image pixel data VIMG from an external source, perform an iteration for each of the virtual image pixel data VIMG using the determined horizontal or vertical displacement(s) to calculate the most appropriate physical pixel data PIMG for each virtual image pixel data VIMG, so that the image distortions due to the horizontal or vertical displacement(s) can be compensated or minimized. The control and analysis unit 300 may store the calculated physical image pixel data PIMG into the compensation mapping table CMT and provide the same to the pattern generator 200 instead of providing the virtual image pixel data VIMG to the pattern generator 200.

In a displacement example illustrated in FIG. 1B where there is a horizontal displacement to the left by one pixel distance, the control and analysis unit 300 may calculate the physical image pixel data PIMG for the input virtual image pixel data VIMG, as shown in FIG. 3A. Here, the virtual image pixel data VIMG and the physical image pixel data PIMG are for the second electronic wallpaper panel 30*b*. In the virtual image pixel data VIMG, first column pixel data VB11 to VB91, respectively may correspond to the first column pixels B11 to B91 of the second electronic wallpaper panel 30*b*, so that the first column pixel data VB11 to VB91 might not be displayed as the first column pixels B11 to B91 of the second electronic wallpaper panel 30*b* are blocked by the first electronic wallpaper panel 30*a*.

Thus, in an embodiment, the physical image pixel data PIMG are calculated to be shifted to the right by one pixel distance as to the virtual image pixel data VIMG, as shown in FIG. 3A. More generally, with respect to the virtual image pixel data VIMG, the physical image pixel data PIMG are calculated to be shifted, by the horizontal displacement, in an opposite direction to a direction which the second electronic wallpaper panel 30*b* is displaced horizontally. For example, the m-th column pixel data VB1m to VB9m are shifted to the (m+1)-th column pixel data P1(m+1) to P9(m+1), respectively. Here, m is an integer such that $1 \leq m \leq j$.

Since the shifted physical image pixel data PIMG are provided to the pattern generator 200 instead of the virtual image pixel data VIMG, the m-th column pixel data VB1m to VB9m may be displayed through the (m+1)-th column pixels B1(m+1) to B9(m+1) of the second electronic wallpaper panel 30*b* without being blocked by the first electronic wallpaper panel 30*a*.

In a displacement example illustrated in FIG. 1D, where there is a vertical displacement of one pixel distance to the upward, the control and analysis unit 300 may calculate the physical image pixel data PIMG for the input virtual image pixel data VIMG, as shown in FIG. 3B.

Thus, the physical image pixel data PIMG are calculated to be shifted to the downward by one pixel distance from the virtual image pixel data VIMG, as shown in FIG. 3B. More generally, from the virtual image pixel data VIMG, the physical image pixel data PIMG are calculated to be shifted, by the vertical displacement, in an opposite direction to a direction which the second electronic wallpaper panel 30*b* is displaced vertically. For example, the n-th row pixel data VBn1 to VBn6 are shifted to the (n+1)-th row pixel data P(n+1)1 to P(n+1)6, respectively.

The n-th row pixel data VBn1 to VBn1 may be displayed through the (n+1)-th row pixels B(n+1)1 to B(n+1)6 of the second electronic wallpaper panel 30*b*, so that the misalignment for the n-th rows of the respective the first and second electronic wallpaper panels 30*a* and 30*b* may be compensated.

Substantially the same or similar methods as/to those given for the displacement examples illustrated in FIGS. 1B and 1D may also be applied for the examples illustrated in FIGS. 1C and 1E. Thus, duplicate descriptions thereof will be omitted for the sake of simplicity. The above-mentioned techniques may be applied to other installation distortions made as the electronic wallpaper panels are stretched in a vertical direction during installation. In this case, the vertical displacements at multiple points (e.g., at least two points) may be checked from top to bottom, or vice versa, of a panel seam and may be used to generate corrective factors (e.g., the physical image pixel data PIMG) applied in the compensation mapping table CMT.

More generally, each physical image pixel data PIMG for each of the virtual image pixel data VIMG is calculated to be shifted, by a horizontal and/or vertical displacement(s), in an opposite direction to a direction which the second electronic wallpaper panel 30*b* is displaced horizontally and/or vertically.

Figure 4:
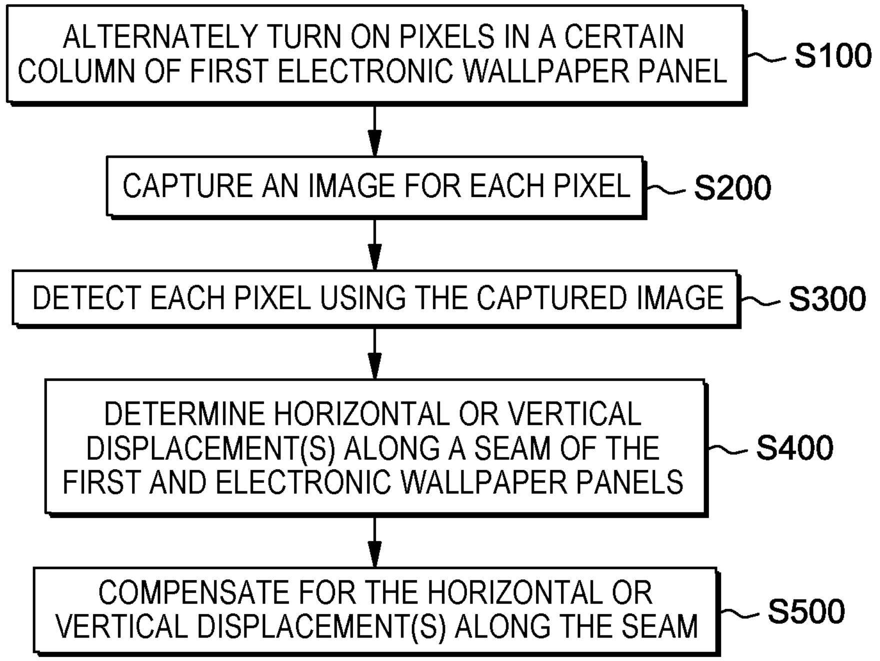
FIG. 4 illustrates a flowchart illustrating a method of compensating for misalignments along a seam of electronic wallpaper panels according to an embodiment.

FIG. 4 is a flowchart illustrating a method of compensating for misalignments along a seam of the electronic wallpaper panels 30*a* and 30*b* according to an embodiment.

Referring to FIG. 4 the method of compensating for misalignments along the seam may include: alternately turn on pixels in a certain column of the first electronic wallpaper panel 30*a* in an operation S100; capturing an image for each of the pixels in the certain column in an operation S200; detecting each pixel using the captured image in an operation S300; determining horizontal or vertical displacement (s) along the seam in an operation S400; and compensating for misalignments by the horizontal or vertical displacement (s) in an operation S500.

Figure 5:
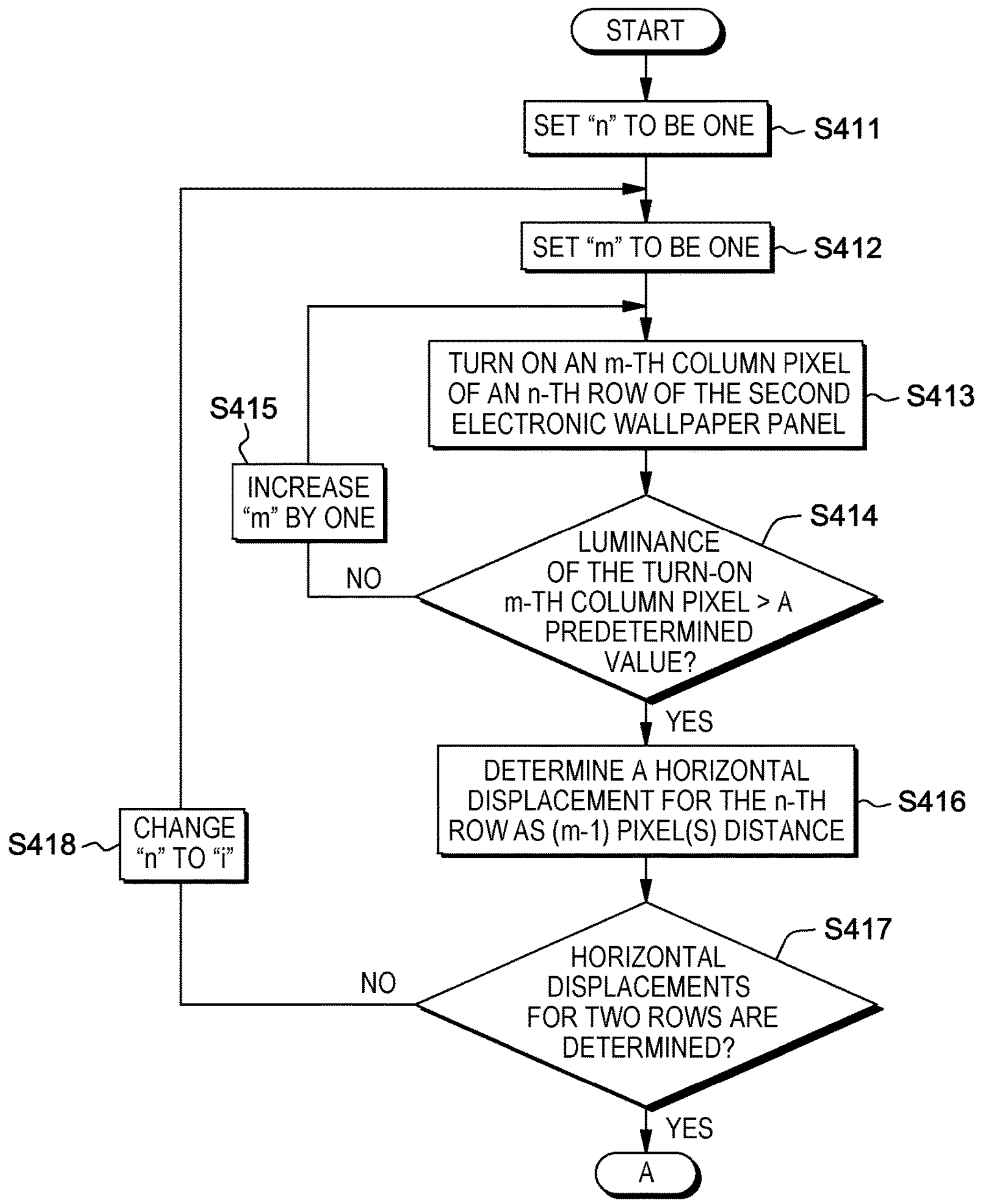
FIG. 5 is a flowchart illustrating a method of determining horizontal displacements along a seam of electronic wallpaper panels according to an embodiment.

FIG. 5 is a flowchart illustrating a method of determining horizontal displacements along a seam of the electronic wallpaper panels 30*a* and 30*b* according to an embodiment.

Referring to FIG. 5, the method of determining horizontal displacements along the seam may include: setting "n" to be one in an operation S411; setting "m" to be one in an operation S412; turning on an m-th column pixel of an n-th row of the second electronic wallpaper panel 30*b* in an operation S413; determining whether luminance of the turn-on m-th column pixel is equal to or higher than a predetermined value in an operation S414; if "no" in the operation S414, increasing "m" by one in an operation S415; if "yes" in the operation S414, determining a horizontal displacement for the n-th row as a (m−1) pixel(s) distance in an operation S416. Thus, the horizontal displacement when m=1 may be understood as zero. The method may further include changing "n" to "i" in an operation S418 if the horizontal displacement is a first determined horizontal displacement in an operation S417. In addition, the method may further include repeating the operations S412 to S416 to determine the horizontal displacement for the i-th row.

Thus, the horizontal displacements for the first and i-th rows may be determined and stored into the memory 600.

Figure 6:
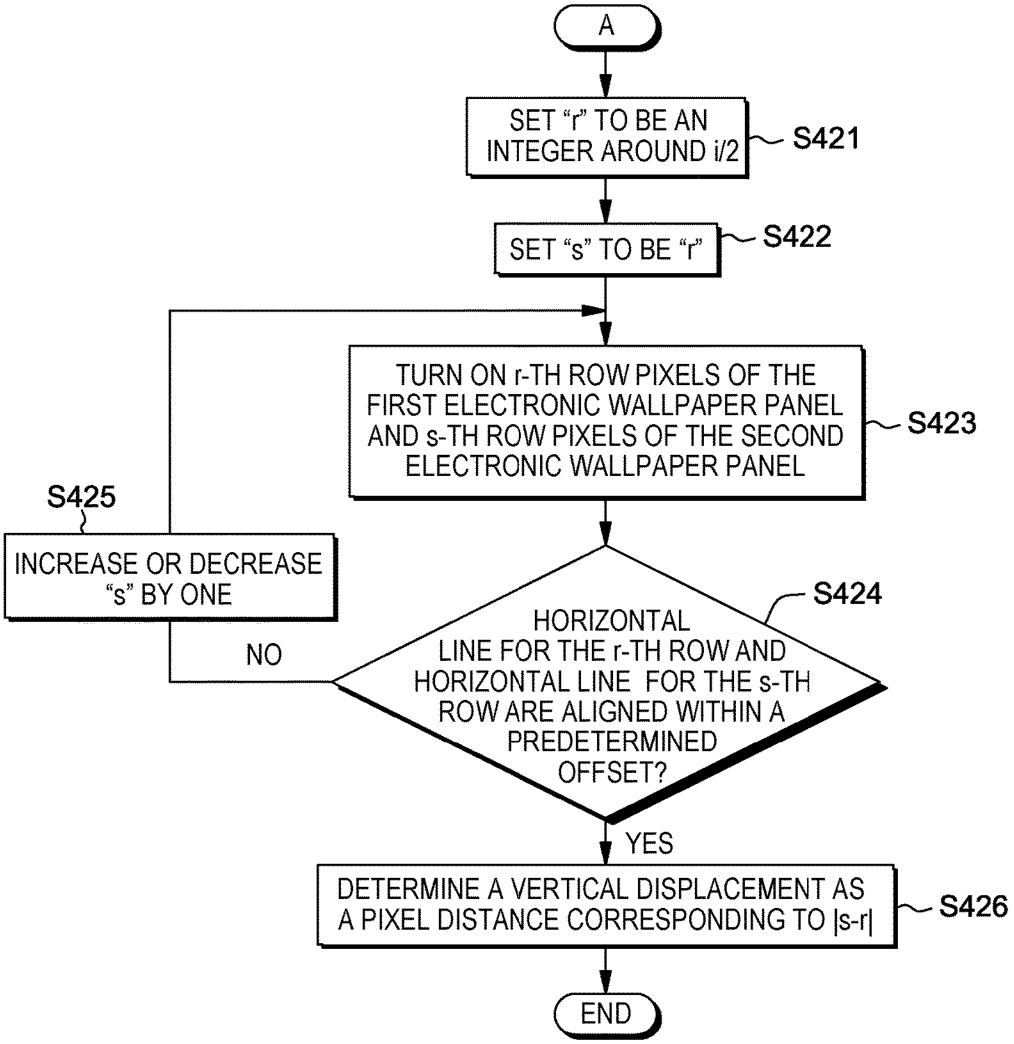
FIG. 6 is a flowchart illustrating a method of determining a vertical displacement along a seam of electronic wallpaper panels according to an embodiment.

FIG. 6 is a flowchart illustrating a method of determining a vertical displacement along a seam of the electronic wallpaper panels 30*a* and 30*b* according to an embodiment.

Referring to FIG. 6, after the horizontal displacements have been determined using the operations S411 to S418 described with reference to FIG. 5, the method of determining the vertical displacement along the seam may be performed by including: setting "r" to be an integer around i/2 in an operation S421; setting "s" to be equal to "r" in an operation S422; turning on pixels of a r-th row of the first electronic wallpaper panel 30*a* and pixels of an s-th row of the second electronic wallpaper panel 30*b* in an operation S423; determine whether a horizontal line of the r-th row and a horizontal line of the s-th row are aligned within a predetermined offset in an operation S424; if "no" in the operation S424, increasing or decreasing "r" by one in an operation S425; if "yes" in the operation S424, determining a vertical displacement as a pixel distance corresponding to a difference of s and r (e.g., $|s-r|$) in an operation S460. In FIG. 6, it is illustrated that "r" is set to be an integer around i/2, the present disclosure is not thereto, and for example, r can be any integer between 1 and i. Here, (s−r) may correspond to an integer and if the (s−r) is a positive value, it may be understood that the vertical displacement of the second electronic wallpaper panel 30*b* occurs to the upward. In addition, if the (s−r) is a negative value, it may be understood that the vertical displacement of the second electronic wallpaper panel 30*b* occurs to the downward.

Thus, in addition to the horizontal displacement, the vertical displacement along the seam of the first and second electronic wallpaper panels 30*a* and 30 may be determined and stored into the memory 600.

Figure 7:
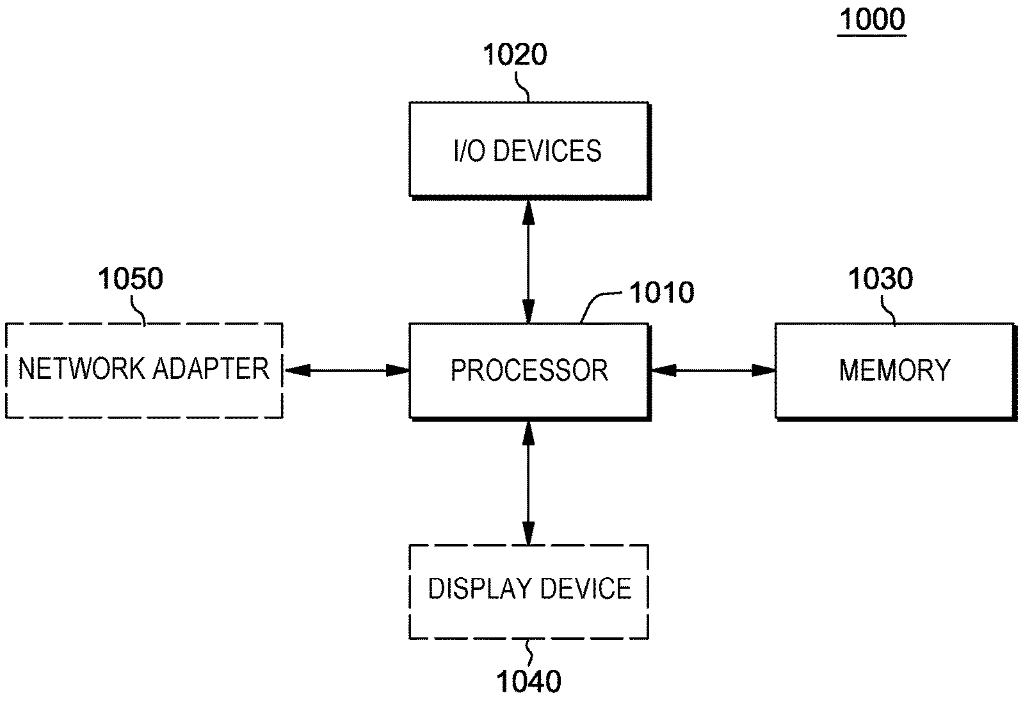
FIG. 7 illustrates an example of a computing system according to an embodiment.

FIG. 7 illustrates an example of a computing system 1000 according to an embodiment.

In an embodiment, the control and analysis unit 300 may be implemented with the computing system 1000. The computing system 1000 may include a processor 1010, an I/O device 1020, and a memory system 1030. The computing system 1000 may include a program module for performing the above-described methods of compensating for the misalignments along the seam of the first and second electronic wallpaper panels 30*a* and 30*b*, according to exemplary embodiments. For example, the program module may include routines, programs, objects, components, logic, data structures, or the like, for performing particular tasks or implement particular abstract data types. The processor 1010 may execute instructions written in the program module to operate the above-described compensation methods for the misalignments along the seam. The program module may be programmed into the integrated circuits of the processor (e.g., 1010). In an embodiment, the computing system 1000 may further include a display device 1040 and a network adaptor 1050. In an exemplary embodiment of the present disclosure, the program module may be stored in the memory system 1030 or in a remote computer system storage media through the network adaptor 1050.

The computing system 1000 may include a variety of computing system readable media. Such media may be any available media that is accessible by the computing system 1000, and it may include both volatile and non-volatile media, removable and non-removable media.

The memory system 1030 can include computer system readable media in the form of volatile memory, such as random access memory (RAM) and/or cache memory or others. The computer system 1000 may further include other removable/non-removable, volatile/non-volatile computer system storage media.

The present disclosure may be a circuit, a system, a method, and/or a computer program product. The computer program product may include a non-transitory computer readable storage medium (e.g., the memory system 1030) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computer system (e.g., 1000) through any type of network, including a LAN or a WAN, or the connection may be made to an external computer (for example, through the Internet using an Internet Service Provider). In an exemplary embodiment of the present disclosure, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, circuits, systems, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of compensating for misalignments along a seam of first and second electronic panels installed for a display device, each of the first and second electronic panels including a plurality of pixels formed in an $i \times j$ matrix, wherein i and j are integers at least one, the method comprising:

- controlling a camera device to be placed over the seam;
- alternately turning on first pixels in a first column of the first electronic panel, the first column being closest to the seam;
- capturing, using the camera device, images for the respective first pixels;
- detecting, using a pattern detector, each of the first pixels based on a corresponding one of the captured images;
- determining at least one horizontal displacement along the seam based on progressively turning on second pixels in a row in the second electronic panel and comparing a respective luminance of each of the turn-on second pixels with a predetermined value; and
- compensating for the misalignments along the seam based on the determined at least one horizontal displacement.

2. The method of claim 1, wherein determining of the at least one horizontal displacement further comprises:

- progressively turning on the second pixels in the row of the second electronic panel in a direction away from the seam, the row being an n-th row of the second electronic panel;
- determining an m-th turn-on second pixel whose luminance is greater than the predetermined value, luminance of the $(m-1)$-th turn-on second pixel being smaller than the predetermined value, wherein m and n are integers such that $1 \le m \le j$ and $1 \le n \le i$;
- determining that an n-th horizontal displacement for the n-th row corresponds to an $(m-1)$ pixels distance; and
- storing the determined n-th horizontal displacement to a memory.

3. The method of claim 2, wherein determining of the at least one horizontal displacement further comprises:

- progressively turning on third pixels in a r-th row of the second electronic panel in the direction away from the seam;
- determining an s-th turn-on third pixel whose luminance is greater than the predetermined value, luminance of the (s−1)-th turn-on third pixel being smaller than the predetermined value, wherein r and s are integers such that 1≤r≤n and n≤r≤i and 1≤s≤j;

determining that an r-th horizontal displacement for the r-th row corresponds to an (s−1) pixels distance; and storing the determined r-th horizontal displacement to the memory.

4. The method of claim 3, wherein n is one of 1 and i and r is another one of 1 and i.

5. The method of claim 2, wherein the predetermined value ranges between a half luminance of a turn-on pixel of the second electronic panel and the luminance of the turn on pixel.

6. The method of claim 1, further comprising determining of a vertical displacement along the seam based on:

turning on pixels in a p-th row of the first electronic panel;

turning on pixels in a q-th row of the second electronic panel;

detecting a first horizontal line corresponding to the turn-on p-th row pixels of the first electronic panel and a q-th horizontal line corresponding to the turn-on q-th row pixels of the second electronic panel, wherein p and q are integers such that 1≤p≤i and 1≤q≤i;

determining that the first horizontal line and the q-th horizontal line are aligned within a predetermined offset;

determining the vertical displacement to be a pixel distance corresponding to an absolute difference of p and q; and storing the determined vertical displacement to the memory.

7. The method of claim 6, wherein the predetermined offset is equal to or smaller than a half pixel distance.

8. The method of claim 6, wherein when the second electronic panel is stretched in a vertical direction in parallel with the seam, determining of the vertical displacement is performed at at least two points along the seam.

9. The method of claim 1, wherein compensating for the misalignments comprises:

storing the determined at least one horizontal displacement along the seam to a memory;

building a compensation mapping table using the stored at least one horizontal displacement in the memory; and compensating for the misalignments using the compensation mapping table.

10. Apparatus of compensating for misalignments along a seam of first and second electronic panels installed for a display device, each of the first and second electronic panels including a plurality of pixels formed in an i×j matrix, wherein i and j are integers at least one, the apparatus comprising:

a controller comprising hardware, the controller controlling a pixel driver for driving first pixels in a first column of the first electronic panel to alternately turn on the first pixels, wherein the first column is closest to the seam;

a camera device placed over the seam to capture images for the respective first pixels in the first column under a control by the controller; and a pattern detector detecting each of the first pixels based on a corresponding one of the captured images, wherein the controller determines at least one horizontal displacement along the seam based on progressively turning on second pixels in a row in the second electronic panel and comparing a respective luminance of each of the turn-on second pixels with a predetermined value and compensates for the misalignments along the seam based on the determined at least one horizontal displacement.

11. The apparatus of claim 10, wherein the controller determines the at least one horizontal displacement further based on:

progressively turning on the second pixels in the row of the second electronic panel in a direction away from the seam, the row being an n-th row of the second electronic panel;

determining an m-th turn-on second pixel whose luminance is greater than the predetermined value, luminance of the (m−1)-th turn-on second pixel being smaller than the predetermined value, wherein m and n are integers such that 1≤m≤j and 1≤n≤i;

determining that an n-th horizontal displacement for the n-th row corresponds to an (m−1) pixels distance; and storing the determined n-th horizontal displacement to a memory.

12. The apparatus of claim 11, wherein the controller determines the at least one horizontal displacement further based on:

progressively turning on third pixels in a r-th row of the second electronic panel in the direction away from the seam;

determining an s-th turn-on third pixel whose luminance is greater than the predetermined value, luminance of the (s−1)-th turn-on third pixel being smaller than the predetermined value, wherein r and s are integers such that 1≤r≤n and n≤r≤i and 1≤s≤j;

determining that an r-th horizontal displacement for the r-th row corresponds to an (s−1) pixels distance; and storing the determined r-th horizontal displacement to the memory.

13. The apparatus of claim 11, wherein the predetermined value ranges between a half luminance of a turn-on pixel of the second electronic panel and the luminance of the turn on pixel.

14. The apparatus of claim 10, wherein the controller further determines a vertical displacement based on:

turning on pixels in a p-th row of the first electronic panel;

turning on pixels in a q-th row of the second electronic panel;

detecting a first horizontal line corresponding to the turn-on p-th row pixels of the first electronic panel and a q-th horizontal line corresponding to the turn-on q-th row pixels of the second electronic panel, wherein p and q are integers such that 1≤p≤i and 1≤q≤i;

determining that the first horizontal line and the q-th horizontal line are aligned within a predetermined offset;

determining the vertical displacement to be a pixel distance corresponding to an absolute difference of p and q; and storing the determined vertical displacement to the memory.

15. The apparatus of claim 14, wherein the predetermined offset is equal to or smaller than a half pixel distance.

16. A computer program product stored in a non-transitory computer-readable storage medium having computer readable program instructions, the computer readable program instructions read and carried out by a processor for performing a method of compensating for misalignments along a seam of first and second electronic panels installed for a display device, each of the first and second electronic panels including a plurality of pixels formed in an i×j matrix, wherein i and j are integers at least one, the method comprising:

controlling a camera device to be placed over the seam;

alternately turning on first pixels in a first column of the first electronic panel, the first column being closest to the seam, capturing, using the camera device, images for the respective first pixels;

detecting, using a pattern detector, each of the first pixels based on a corresponding one of the captured images;

determining at least one horizontal displacement based on progressively turning on second pixels in a row in the second electronic panel and comparing a respective luminance of each of the turn-on second pixels with a predetermined value along the seam; and compensating for the misalignments along the seam based on the determined at least one horizontal displacement.

17. The computer program product of claim 16, wherein determining of the at least one horizontal displacement comprises:

progressively turning on the second pixels in the row of the second electronic panel in a direction away from the seam, the row being an n-th row of the second electronic panel;

determining an m-th turn-on second pixel whose luminance is greater than the predetermined value, luminance of the (m−1)-th turn-on second pixel being smaller than the predetermined value, wherein m and n are integers such that $1 \le m \le j$ and $1 \le n \le i$;

determining that an n-th horizontal displacement for the n-th row corresponds to an (m−1) pixels distance; and storing the determined n-th horizontal displacement to a memory.

18. The computer program product of claim 17, wherein determining of the at least one horizontal displacement further comprises:

progressively turning on third pixels in a r-th row of the second electronic panel in the direction away from the seam;

determining an s-th turn-on third pixel whose luminance is greater than the predetermined value, luminance of the (s−1)-th turn-on third pixel being smaller than the predetermined value, wherein r and s are integers such that $1 \le r \le n$ and $n \le r \le i$ and $1 \le s \le j$;

determining that an r-th horizontal displacement for the r-th row corresponds to an (s−1) pixels distance; and storing the determined r-th horizontal displacement to the memory.

19. The computer program product of claim 16, wherein the method further comprising determining of a vertical displacement along the seam based on:

turning on pixels in a p-th row of the first electronic panel;

turning on pixels in a q-th row of the second electronic panel;

detecting a first horizontal line corresponding to the turn-on p-th row pixels of the first electronic panel and a q-th horizontal line corresponding to the turn-on q-th row pixels of the second electronic panel, wherein p and q are integers such that $1 \le p \le i$ and $1 \le q \le i$;

determining that the first horizontal line and the q-th horizontal line are aligned within a predetermined offset;

determining the vertical displacement to be a pixel distance corresponding to an absolute difference of p and q; and storing the determined vertical displacement to the memory.

20. The computer program product of claim 16, wherein compensating for the misalignments comprises:

storing the determined at least one horizontal displacement along the seam to a memory;

building a compensation mapping table using the stored at least one horizontal displacement; and compensating for the misalignments using the compensation mapping table.

* * * * *